United States Patent [19]
Koyama et al.

[11] Patent Number: 6,028,471
[45] Date of Patent: *Feb. 22, 2000

[54] SWITCHING DEVICE WITH PARALLEL SWITCH

[75] Inventors: Kenichi Koyama; Yukimori Kishida; Hiroyuki Sasao; Hiroshi Yamamoto, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/807,834

[22] Filed: Feb. 27, 1997

[30] Foreign Application Priority Data

Feb. 27, 1996 [JP] Japan .................................. 8-040044

[51] Int. Cl.[7] .................................................. H03K 17/72
[52] U.S. Cl. ............................ 327/438; 327/441; 327/108
[58] Field of Search .................... 327/108–112, 438–442

[56] References Cited

U.S. PATENT DOCUMENTS 4,025,820  5/1977  Penrod ........................................ 361/8
4,264,895  4/1981  Takeshita et al. ................... 340/166 R

FOREIGN PATENT DOCUMENTS

B-7/108072  11/1995  Japan .

OTHER PUBLICATIONS

"Condenser Control Apparatus Used For Power Source for a Levitated Railway" by Kazurou Ikeda et al, 24th Japan Railway Cybernetics Association, Nov. 1987.

*Primary Examiner*—Kenneth B. Wells
*Attorney, Agent, or Firm*—Sughrue, Mion, Zinn Macpeak & Seas, PLLC

[57] ABSTRACT

A switching device has a control section to transfer a gate control signal which switches plural thyristors from an ON state to an OFF state after a parallel switch is open and an opening degree of the parallel switch is met where no arc discharge is generated at a contact point in the parallel switch.

16 Claims, 8 Drawing Sheets

(PRIOR ART)
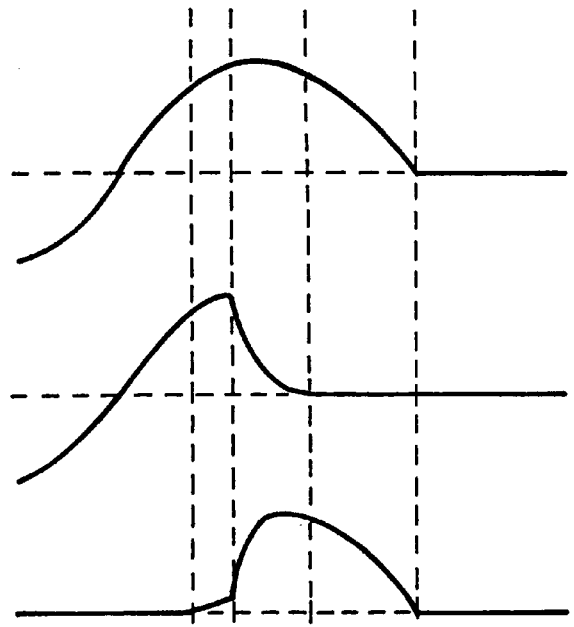
FIG.2A
FIG.2B
FIG.2C
FIG.2D ON POSITION OF CONTACT SWITCH
OFF POSITION OF CONTACT SWITCH
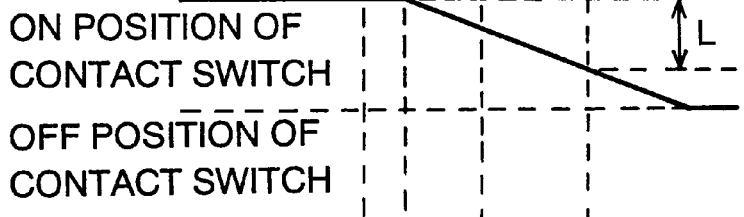
FIG.2E ON / OFF
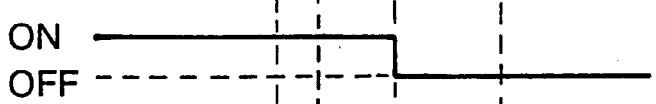
FIG.2F ON / OFF
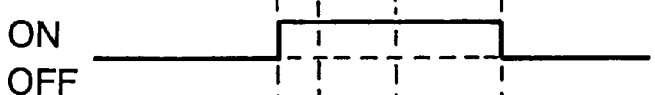
FIG.2G
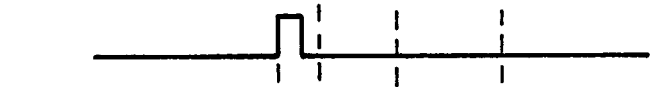
FIG.2H
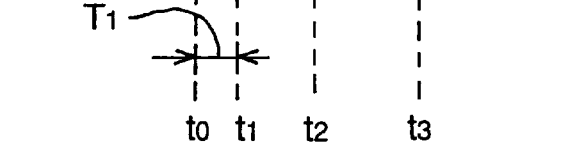
$T_1$
$t_0$ $t_1$ $t_2$ $t_3$ (PRIOR ART)
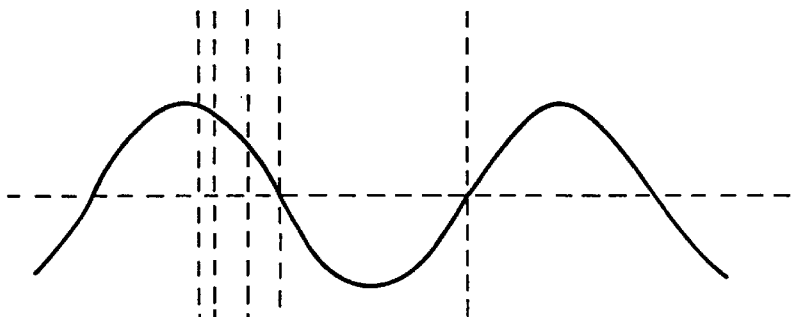
FIG.3A
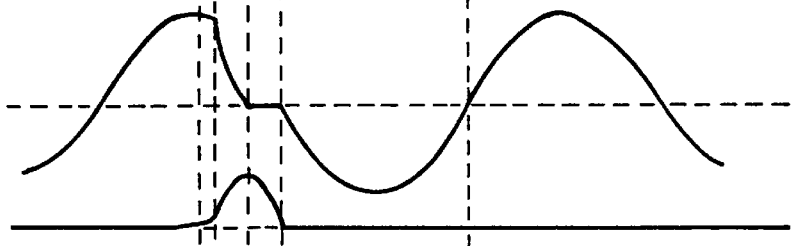
FIG.3B
FIG.3C
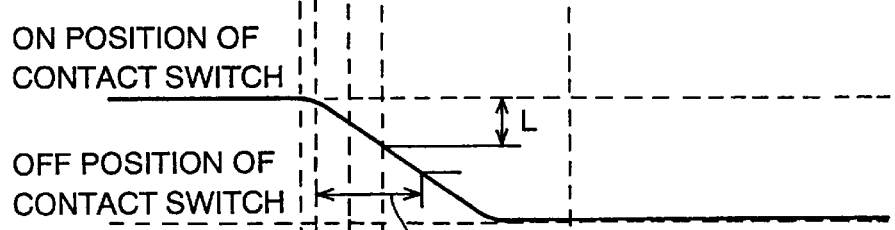
FIG.3D
FIG.3E
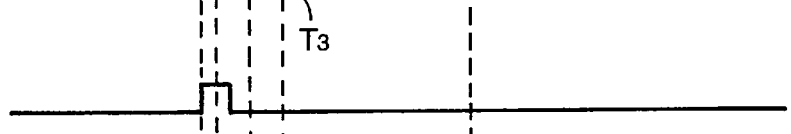
FIG.3F
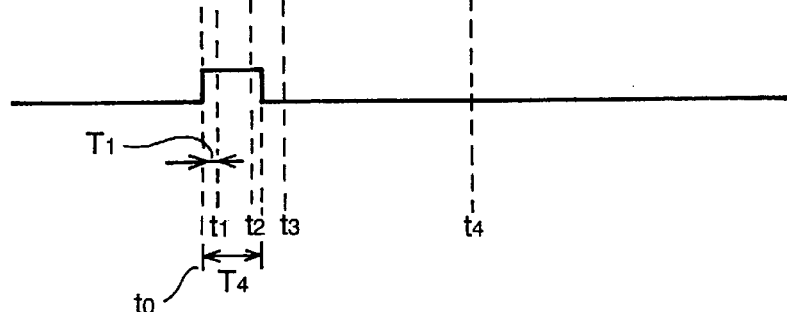
T4<T1+T3

$T_4 > T_1 + T_3$

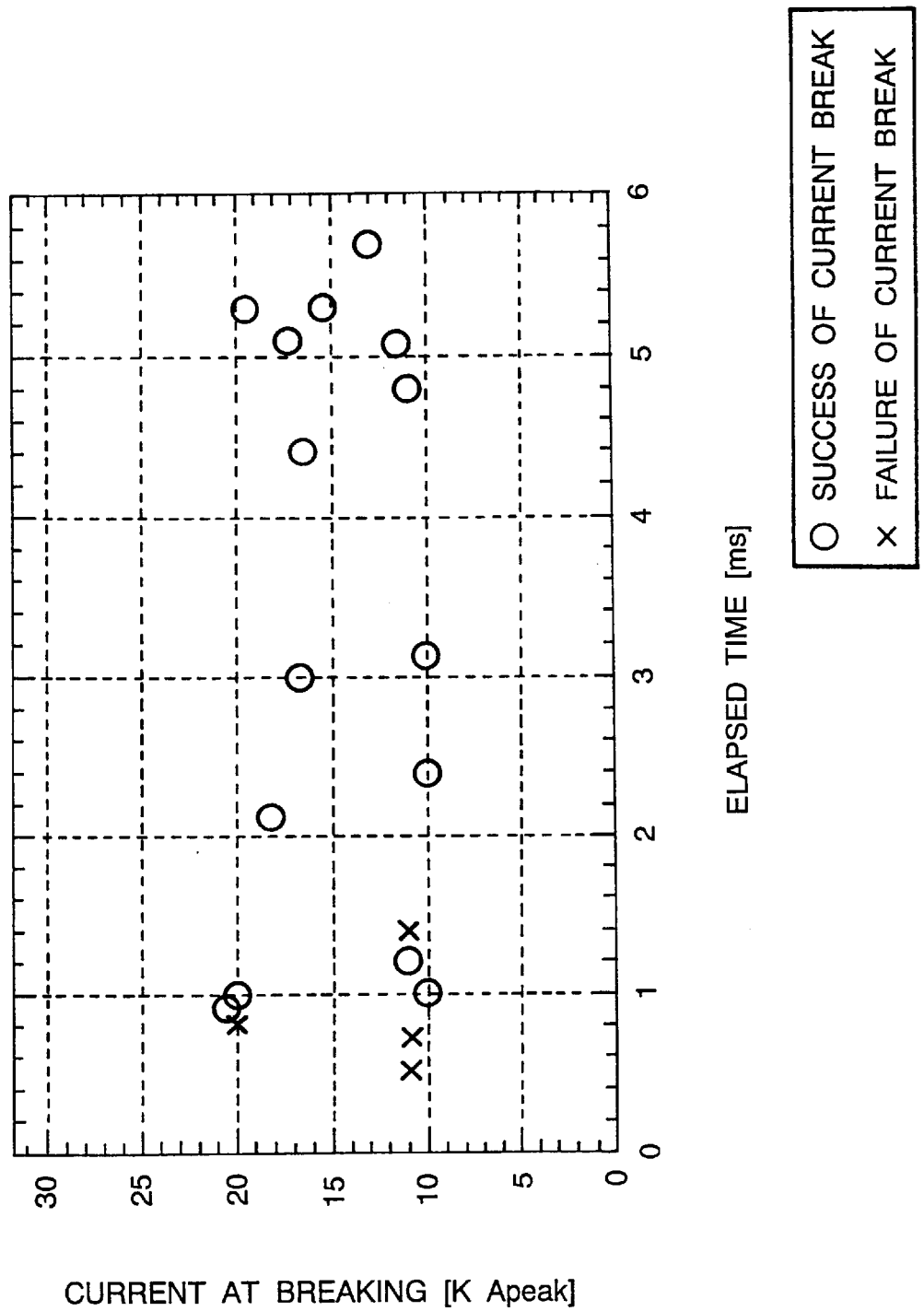

ON POSITION OF CONTACT SWITCH

OFF POSITION OF CONTACT SWITCH $T_5 + T_4 > T_1 + T_3$

SWITCHING DEVICE WITH PARALLEL SWITCH

BACKGROUND OF THE INVENTION

1. Field of the Invention

The present invention relates to a switching device having a configuration in which a parallel switch is connected to a semiconductor device such as thyristors in parallel, the parallel switch opens and closes current paths by opening and closing mechanical contacts in the parallel switch.

2. Description of the Related Art

FIG. 1 is a circuit diagram showing a configuration of a conventional switching device that was disclosed in a Japanese publication No. JP-B-7/108072. In FIG. 1, reference number 10 designates a thyristor circuit comprising three pairs of thyristors 11, 12, and 13 for performing a switching operation of current paths L11, L12, and L13. Each pair of thyristors 11, 12, and 13 comprises two thyristors connected in parallel and whose connected-directions of the thyristors are in opposite directions to each other. Reference number 20 denotes parallel switches comprising contact switches 21, 22 and 23 connected to the pairs of the thyristors 11, 12, and 13 in parallel for switching the current paths L11, L12, and L13 connected to each thyristor 11, 12, and 13 in the thyristor circuit 10 by opening and closing the contact switches 21, 22, and 23. Reference number 30 indicates a control section for generating a control signal indicating opening and closing of the current paths L11, L12, and L13 to which the each pair of thyristors 11, 12, and 13 and the parallel switches 21, 22, and 23 are connected.

Next, a description will now be given of the operation of the conventional switching device shown in FIG. 1.

Although each current flowing through each of the current paths L11, L12, and L13 has a different signal phase to each other, the operation of the current is the same, Accordingly, only the operation of the current flowing through the current path L11 having one current signal phase will now be explained as a typical case.

When the current path L11 is closed, the pair of thyristors 11 enters an off state (no current flows through the pair of thyristors 11) in order to reduce the loss of the power consumption of the thyristor circuit 10. In this case, the current I2 flows through the contact switch 21 in the parallel switches 20 connected to the pair of thyristors 11 in parallel in order to eliminate the loss of a large power consumption in the thyristor circuit 10.

When the current path L11 is open (through which the current I2 flows) by the parallel switch 20 under the control of the control section 30, the thyristor circuit 10 enters an On state (or it enters an active state) and the thyristor circuit 10 controls the current flow so that the current I3 flows through the pair of thyristors 11 and to halt the current I2 flowing through the current path L11. Thereby, the current I2 flowing through the current path L11 is cut off.

The operation of the conventional switching device in the above-described state will now be explained with reference to timing charts of FIGS. 2A to 2H.

FIG. 2A is a timing chart showing a time-change of the total current flow I1 flowing through the current path L11. FIG. 2B is a waveform showing a time-change of the current I2 flowing through the current path L11. FIG. 2C is a waveform showing a time-change of the current I3 flowing through the pair of thyristors 11. FIG. 2D shows a curve of an opening operation of the contact switch 21 in the parallel switch 20. FIG. 2E shows a time-change of the state of the contact switch 21 in the parallel switch 20. FIG. 2F shows a time-change of the state of the pair of thyristors 11 in the thyristor circuit 10. FIG. 2G is a waveform of an opening control signal transferred from the control section 30 to the contact switch 21 in the parallel switch 20. FIG. 2H is a waveform of a gate signal indicating a switching operation transferred from the control section 30 to the pair of thyristors 11 in the thyristor circuit 10.

In order to obtain a state where the current path L11 is open, the control section 30 generates the opening control signal shown in FIG. 2G and transfers the opening control signal to the contact switch 21 in the parallel switch 20. In addition, the control section 30 generates the gate signal having a short time-width shown in FIG. 2H and transfers the gate signal to the pair of thyristors 11. Thereby, the pair of thyristors 11 changes to the ON state from the OFF state. In this state, the amount of current flow is determined by a ratio between an impedance of the contact switch 21 in the parallel switch 20 and an impedance of the pair of thyristors 11 (Time t0).

After the opening time-length (Time period T1) of the parallel switch 20, counted from when the opening control signal is received by the parallel switch 20, is elapsed, the contact switch 21 in the parallel switch 20 is opened. Thereby, arc discharge is generated at the contact switch 21 (Time t1). Because a resistance value of the contact switch 21 in the arc discharge is larger than that of the pair of thyristors 11, the current flows through the pair of thyristors 11 (see FIGS. 2B and 2C). After the current flow changes from the parallel switch 20 to the thyristor circuit 10 is completed (Time t2) shown in FIGS. 2B and 2E, the total current flows through the pair of thyristors 11 shown in FIGS. 2A and 2C. Then, the pair of thyristors 11 halts this current I1 flowing through the current path L11 when the thyristor 11 is open based on the gate signal transferred from the control section 30 (Time t1). In this case, the opening distance of the contact switch 21 in the parallel switch 20 is L (see FIG. 2D).

The conventional switching device having the structure described above has a problem in that the parallel switch 20 re-enters the active state even if the current path L11 is cut-off by the operation of the pair of thyristors 11. That is, it is difficult to cut-off or break the current path L11 completely in the conventional switching device because the open distance L of the contact switch 21 in the parallel switch 20 is shorter in break time (cut-off time) t3 than the magnitude of a voltage applied to the parallel switch 20 and the thyristor circuit 10 after the break (cut-off) of the current path L11, when the time-length from the receiving time (Time t0) of the opening control signal by the parallel switch 20 to the break (cut-off) completion time (Time t3) of the current path L11 is shorter.

The operation when the contact switch 21 in the parallel switch 20 re-starts will now be explained with reference to FIGS. 3A to 3F.

FIG. 3A is a timing chart showing a time-change of the total current flow I1 flowing through the current path L11. FIG. 3B is a waveform showing a time-change of the current flow I2 flowing through the contact switch 21 in the parallel switch 20. FIG. 3C is a waveform showing a time-change of the current flow I3 flowing through the pair of thyristors 11. FIG. 3D shows a curve of an opening operation of the contact switch 21 in the parallel switch 20. FIG. 3E is a waveform of an opening control signal transferred from the control section 30 to the contact switch 21 in the parallel switch 20. FIG. 3F is a waveform of a gate signal indicating a switching operation transferred from the control section 30 to the pair of thyristors 11 in the thyristor circuit 10.

When the open distance L of the contact switch 21 has no adequate distance to the voltage applied to the parallel switch 20 at the time t3 at which the current path L11 is open, an electronic breakdown happens at the contact switch 21 where arc discharge is generated. In this case, the current I1 in the current path L11 flows through the contact switch 21 in the parallel switch 20. This causes a failure of the current break of the current path L11.

The function of the parallel switch 20 when the current paths L11, L12, and L13 are open is that the current flows through the thyristor circuit 10. However, the parallel switch 20 in the conventional switching device shown in FIG. 1 has no special breakdown function to eliminate the above described case. In this case, the parallel switch 20 cannot break (or cannot cut-off) the current flow at the time T4 when the amount of the total current I1 becomes zero. Therefore the conventional switching device cannot break (or cannot cut-off) the current flow I1 as long as it is detected to enter the parallel switch 20 into the active state again. At this time, the time-length T4 of the gate signal transferred from the control section 30 to the pair of the thyristors 11 is shorter than that of the sum of the opening time-length T1 of the contact switch 21 in the parallel switch 20 and the time required to set the parallel switch 20 into the state where it is re-entered into the active state.

As described above, in the conventional switching device having the configuration shown in FIG. 1, there is the problem that the conventional switching device cannot break (or cannot cut-off) the current path L12 completely because the parallel switch 2 re-enters the active state.

SUMMARY OF THE INVENTION

In order to overcome the problem of the conventional switching device, it is an object of the present invention to provide a switching device having a high reliability which is capable of breaking (or cutting off) current completely.

In accordance with one aspect of the present invention, a switching device comprises a semiconductor circuit for opening and closing a first current path, a parallel switch having a contact switch connected to the semiconductor circuit in parallel for opening and closing a second current path that is placed in parallel to the first current path, and a control means for generating opening-closing control signals indicating to open and to close the first current path and the second current path and for transferring the opening-closing control signals to the semiconductor circuit and the parallel switch, for switching the semiconductor circuit from the ON state to the OFF state after a time required to keep the voltage resistance of the contact switch against a voltage applied to the parallel switch which is elapsed immediately after the first current path and the second current path are open.

In accordance with another preferred embodiment of the switching device according to the present invention, after the control section transfers the opening-closing control signal indicating a break of the second current path to the parallel switch, the control section changes the semiconductor circuit from the ON state to the OFF state after a required sum of time to open the contact switch in the parallel switch completely and a required minimum time to generate no arc discharge at the contact switch, in the parallel switch is elapsed.

In accordance with another preferred embodiment of the switching device according to the present invention, the semiconductor circuit comprises thyristors.

In accordance with another preferred embodiment of the switching device according to the present invention, the control section transfers simultaneously an opening control signal, to the parallel switch, indicating to open the second current path connected to the parallel switch and a gate control signal indicating to change the thyristors from the ON state to the OFF state and to keep the ON state of the thyristors during not less than 2.5 msec for the thyristors.

In accordance with another preferred embodiment of the switching device according to the present invention, the control section transfers the gate control signal indicating to the change of the thyristors from the ON state to the OFF state after a time of not less than 2.5 msec is elapsed counted after the opening control signal indicating to open the second current path connected to the parallel switch is transferred to the parallel switch.

In accordance with another preferred embodiment of the switching device according to the present invention, the semiconductor circuit comprises a plurality of semiconductor elements which are connected in parallel to each other and the connected direction of each semiconductor element is in an opposite direction.

In accordance with another preferred embodiment of the switching device according to the present invention, the contact switch in the parallel switch comprises a vacuum valve.

In accordance with another preferred embodiment of the switching device according to the present invention, an opening mechanism used in the parallel switch comprises an electromagnetic switching system.

In accordance with another preferred embodiment of the switching device according to the present invention, the control section transfers a gate control signal, to the semiconductor circuit, indicating to change the semiconductor circuit from the OFF state to the ON state and to keep the ON state of the semiconductor circuit during a predetermined time-length after a first time is elapsed after the opening-closing control signal is transferred to the parallel switch, and wherein the control section controls so that a sum of the first time and a time-length of the gate control signal is larger than a sum of the opening time of the parallel switch and the minimum breakable arc time-length of the parallel switch.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 2A is a timing chart showing a time-change of the total current I1 flowing through a current path in the conventional switching device shown in FIG. 1.

FIG. 2B is a waveform showing a time-change of the current I2 flowing through a current path in the conventional switching device shown in FIG. 1.

FIG. 2C is a waveform showing a time-change of the current I3 flowing through the pair of thyristors 11 in the conventional switching device shown in FIG. 1.

FIG. 2D shows a curve of an opening operation of a contact switch in the parallel switch in the conventional switching device shown in FIG. 1.

FIG. 2E shows a time-change of the state of the contact switch in the parallel switch in the conventional switching device shown in FIG. 1.

FIG. 2F shows a time-change of the state of the pair of thyristors in a thyristor circuit in the conventional switching device shown in FIG. 1.

FIG. 2G is a waveform of an opening control signal transferred from a control section to the contact switch in the parallel switch in the conventional switching device shown in FIG. 1.

FIG. 2H is a waveform of a gate signal indicating a switching operation transferred from the control section to the pair of thyristor circuit.

FIG. 3A is a timing chart showing a time-change of the total current flow I1 flowing through the current path in the conventional switching device shown in FIG. 1.

FIG. 3B is a waveform showing a time-change of the current flow I2 flowing through the contact switch in the parallel switch in the conventional switching device shown in FIG. 1.

FIG. 3C is a waveform showing a time-change of the current flow I3 flowing through the pair of thyristors in the conventional switching device shown in FIG. 1.

FIG. 3D shows a curve of an opening operation of the contact switch in the parallel switch in the conventional switching device shown in FIG. 1.

FIG. 3E is a waveform of an opening control signal transferred from the control section to the contact switch in the parallel switch in the conventional switching device shown in FIG. 1.

FIG. 3F is a waveform of a gate signal indicating a switching operation transferred from the control section to the pair of thyristors in the thyristor circuit in the conventional switching device shown in FIG. 1.

FIG. 6 is a graph showing data of a break test (cut-off test).

DESCRIPTION OF THE PREFERRED EMBODIMENTS

Other features of this invention will become apparent through the following description of preferred embodiments which are given for illustration of the invention and are not intended to be limiting thereof.

Preferred embodiments of a switching device according to the present invention will now be described with reference to the drawings.

First Embodiment

Figure 4:
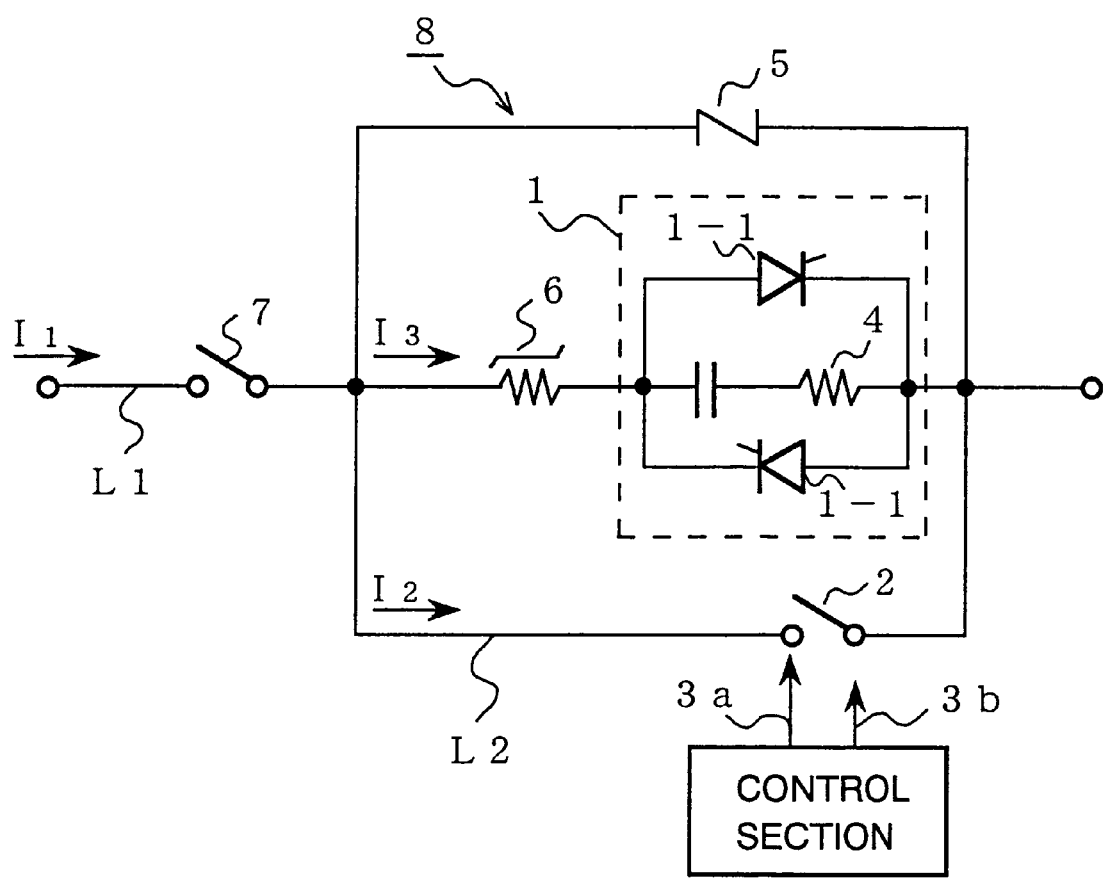
FIG. 4 is a circuit diagram showing a configuration of a switching device according to the first embodiment of the present invention.

FIG. 4 is a circuit diagram showing a configuration of a switching device according to the first embodiment of the present invention. In FIG. 4, reference number 1 designates a thyristor circuit comprising thyristors 1-1 (semiconductor elements). Reference number 2 denotes a parallel switch comprising a contact switch that can be opened and closed under control of a control section 3. The contact switch in the parallel switch 2 incorporates an electromagnetic switching system and whose contact section is formed by using a vacuum valve. This parallel switch 2 is connected to the thyristor circuit 1.

Reference number 3 indicates the control section for generating and transferring a gate control signal and an opening control signal to the thyristor circuit 1 and the parallel switch 2. The gate control signal indicates to open and close the current paths L1 and L2. The control section 3 comprises a timing adjustment means and a time-length adjustment means. The timing adjustment means adjusts a timing to transfer the gate control signal and the opening control signal to the thyristor circuit 1 and the parallel switch 2. The time-length adjustment means adjusts a time-length of the gate control signal and the opening control signal.

The time-length adjustment means comprises a counter, a CR time constant circuit and the like, for example. It can be acceptable to make the time-length adjustment means by using a program software. Similarly, the timing adjustment means comprises a counter and the like, for example. It can also be acceptable to make the timing adjustment means by using a program software.

Reference characters 3a and 3b designate signal lines through which the opening control signal and the gate control signal are transferred from the control section to the parallel switch 2 and the thyristor circuit 1, respectively. Reference number 4 denotes a snubber circuit connected to the thyristors 1-1 in parallel in the thyristor circuit 1 for absorbing an impulse generated at a switching operation in the thyristor circuit 1. Reference number 5 indicates an arrester connected to the thyristor circuit 1 in parallel for protecting the thyristor circuit 1 from an over-voltage. Reference number 6 designates a surge current absorber connected to the thyristor circuit 1 in series for protecting the thyristor circuit 1 from the surge current. Reference number 7 denotes a disconnector connected to the switching device in series.

The rating of the switching device having the above configuration as the first embodiment is 7.2 kV–12.5 kA. It can be acceptable to apply the configuration of the switching device as the first embodiment to multi-phase current paths such as a three-phase alternating current used in the conventional switching device shown in FIG. 1.

A description will now be given of the operation of the switching device of the first embodiment shown in FIG. 4 with reference to FIGS. 5A–5F, FIG. 6, and FIG. 7.

Figure 5A:
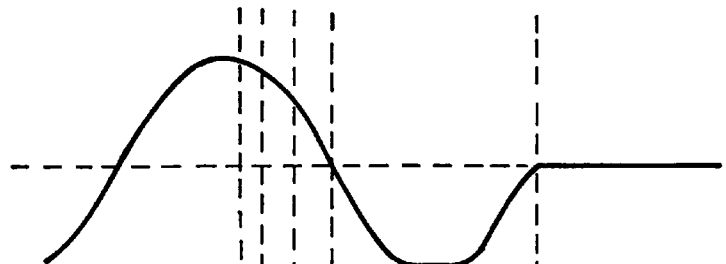
FIG. 5A is a waveform showing a time-change of the total current I1 flowing through a current path connected to the switching device according to the first embodiment shown in FIG. 4.
Figure 5B:
FIG. 5B is a waveform showing a time-change of the current I2 flowing through a parallel switch in the switching device of the first embodiment shown in FIG. 4.
Figure 5C:
FIG. 5C is a waveform showing a time-change of the current I3 flowing through a current path connected to a thyristor circuit in the switching device of the first embodiment shown in FIG. 4.
Figure 5D:
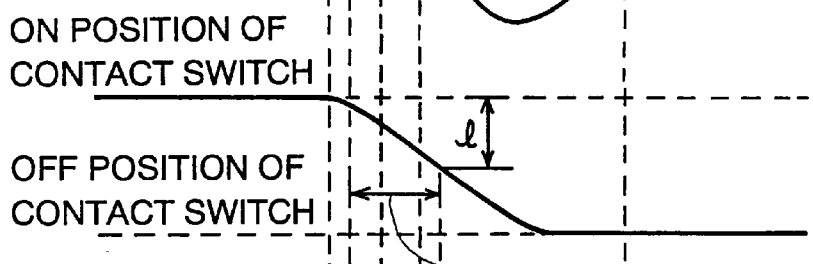
FIG. 5D shows a curve of an opening operation of the parallel switch in the switching device of the first embodiment shown in FIG. 4.
Figure 5E:
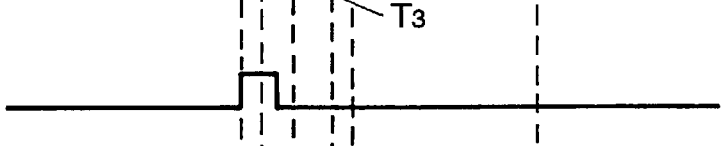
FIG. 5E shows a waveform of an opening control signal transferred from a control section to the parallel switch through a signal line 3a in the switching device of the first embodiment shown in FIG. 4.
Figure 5F:
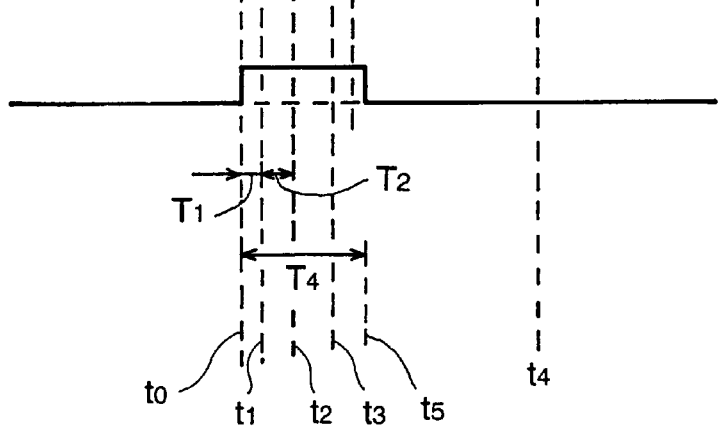
FIG. 5F is a waveform of a gate signal indicating a switching operation transferred from the control section to the thyristor circuit through a signal line 3b in the switching device of the first embodiment shown in FIG. 4.

FIG. 5A is a waveform showing a time-change of the total current I1 flowing through a current path connected to the switching device 8 according to the first embodiment shown in FIG. 4. FIG. 5B is a waveform showing a time-change of the current I2 flowing through a parallel switch 2 in the switching device 8 of the first embodiment shown in FIG. 4. FIG. 5C is a waveform showing a time-change of the current I3 flowing through a current path connected to the thyristor circuit 1 in the switching device 8 of the first embodiment shown in FIG. 4. FIG. 5D shows a curve of an opening operation of the parallel switch 2 in the switching device 8 of the first embodiment shown in FIG. 4. FIG. 5E shows a waveform of the opening control signal transferred from the control section 3 to the parallel switch 2 through the signal line 3a in the switching device 8 of the first embodiment shown in FIG. 4. FIG. 5F is a waveform of the gate control signal indicating a switching operation transferred from the control section 3 to the thyristor circuit 1 through the signal line 3b in the switching device 8 of the first embodiment shown in FIG. 4.

Figure 1:
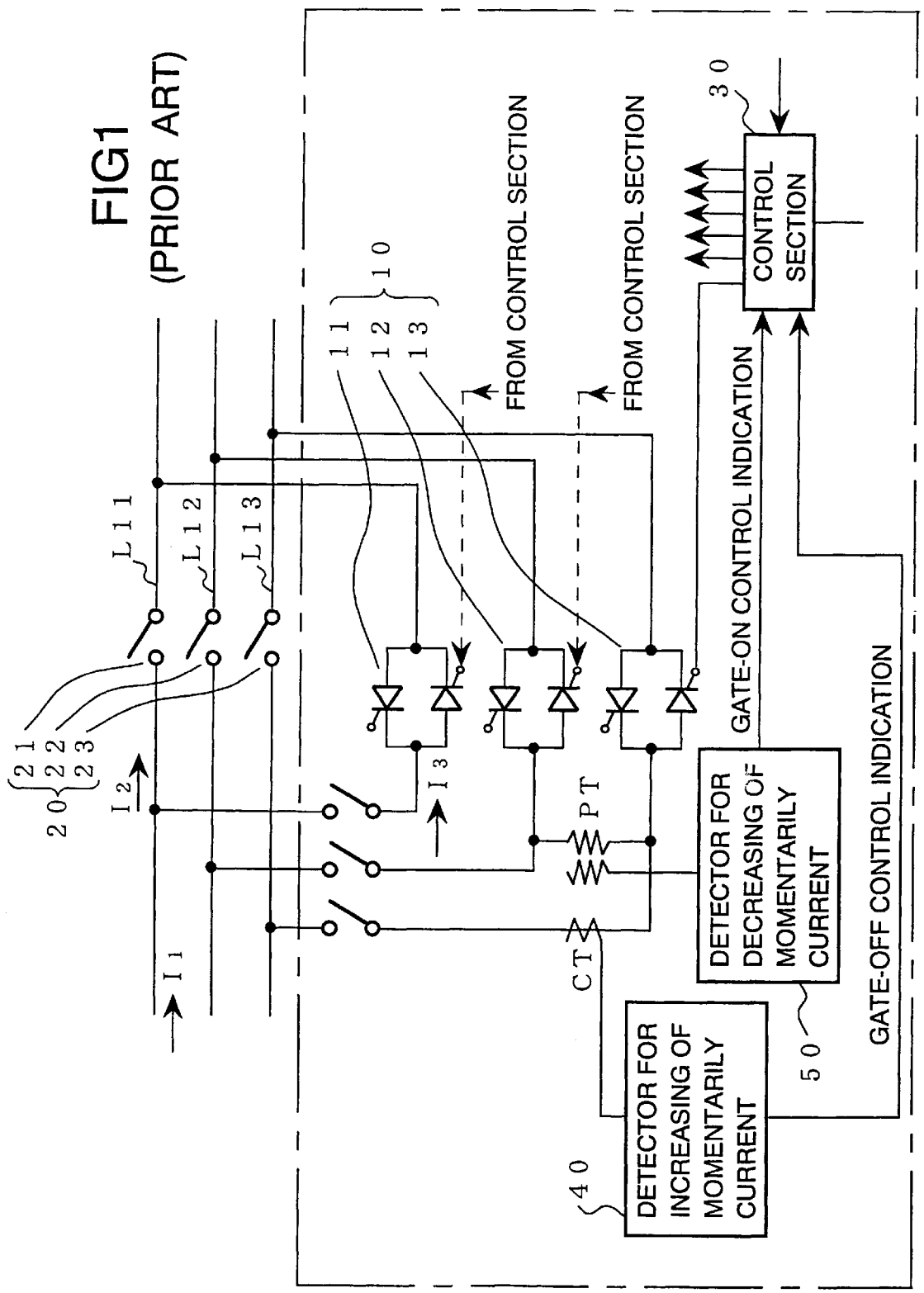
FIG. 1 is a circuit diagram showing a configuration of a conventional switching device.

When the current path L1 connected to the switching device 8 is closed, the thyristor circuit 1 in the switching device 8 enters the OFF state (no current flows through the thyristor circuit 1) in order to reduce the loss of the power consumption of the thyristor circuit 1, like the conventional switching device 4 shown in FIG. 1.

In this case, the current I1 flows through the parallel switch 2 connected to the thyristor circuit 1 in parallel. This prevents the loss of power consumption generated by the current flowing through the thyristor circuit 1 (see FIGS. 5A to 5C).

As shown in FIGS. 5A to 5F, when the current path L2 is open, the control section 3 generates the opening control signal shown in FIG. 5E and transfers the opening control signal to the parallel switch 2. At the same time, the control section 3 also generates the gate control signal having the time-length T4 (more than 2.5 msec) shown in FIG. 5F and transfers the gate control signal to the thyristor circuit 1. When receiving the gate control signal, the thyristor circuit 1 enters the ON state (or the active state) in which the current flows through the thyristor circuit 1 (Time t1). In this case, the magnitude of the current flowing through the thyristor circuit 1 is determined by a ratio of an impedance of the parallel switch 2 and the impedance of the thyristor circuit 1.

After the opening time-length of the parallel switch 2 is elapsed (or the parallel switch 2 is open completely, approximately after Time T1 (1 msec) counted after the parallel switch 2 receives the opening control signal), the contact switch (not shown) in the parallel switch 2 is open and an arc discharge is generated at the contact switch (Time t1). Because the magnitude of a resistance of the contact switch is larger than that of the thyristor circuit 1, the current flows through the thyristor circuit 1, not flows through the parallel switch 2 (see FIGS. 5B and 5C).

As shown in FIGS. 5B and 5C, after the current flow is changed from the parallel switch 2 to the thyristor circuit 1 (Time t2), the whole current I1 flows through the thyristor circuit 1 and no arc discharge is generated at the contact switch in the parallel switch as shown in FIG. 5B.

After this, the magnitude of the total current I1 becomes zero at a zero time-point (Time t3). If the zero time-point takes place before the minimum breakable arc time T3 of the parallel switch 2, counted from the time t1 at which the parallel switch 2 is open and the arc discharge is generated, the arc discharge is generated again at the contact switch in the parallel switch 2 and the parallel switch 2 enters the active state or the ON state, like the case of the conventional switching device. In this case, the time T3 is the time to open the contact switch by the minimum distance L of the contact switch at which no arc discharge is generated under the applied voltage.

In order to avoid this phenomenon, in the switching device 8 of the first embodiment according to the present invention, as shown in FIG. 4 and FIGS. 5A and 5F, the control section 3 transfers the opening control signal to the parallel switch 2 and the gate control signal to the thyristor circuit 1 at the same time, and the control section 3 controls the time-length T4 of the gate control signal transferred to the thyristor circuit 1 to be longer than the sum of the time-length of the opening control signal transferred to the parallel switch 2 and the minimum breakable arc time T3. Thereby, the current I3 flows through the thyristor circuit 1 after the zero time-point of the current I1, and the parallel switch cannot enter the active state again. Therefore, the parallel switch 2 is open completely at the zero time-point of the current I1 (Time t4).

In the switching device having the rating 7.2 kV–12.5 kA, because the opening time-length is the value of 1 msec and the minimum breakable arc time is the value of 1.5 msec, the time length of the gate control signal T4 to be transferred to the thyristor circuit 1 must be not less than 2.5 msec.

FIG. 6 is a graph showing experimental data as the results of the break test of only the parallel switch 2 having the rating 7.2 kV–12.5 kA. The horizontal axis in FIG. 6 means an elapsed time counted from the time at which the parallel switch 2 is open or cut-off. The vertical axis in FIG. 6 indicates the magnitude of the current flow at the break of the parallel switch 2 when the parallel switch 2 is open or cut-off. In FIG. 6, reference character ○ indicates the success of the current break where no arc discharge is generated. Reference character X designates the failure of the current break where the arc discharge is generated and the current flows through the parallel switch 2.

It can be seen from the experimental results as shown in FIG. 6, although the parallel switch 2 used for this test causes failure of the current break when the parallel switch 2 is open only during the time-length of 1.5 msec or less, the parallel switch 2 can not cause the current break when the parallel switch 2 is open during the time-length of approximately 2 msec or more. Therefore, the time-length 1.5 msec becomes the minimum breakable arc time T3.

The reason for the failure of the current break of the parallel switch 2 under a short time-length of less than 1.5 msec, seems to be that the open distance of the contact switch in the parallel switch 2 is not adequate in distance to the voltage applied after the current break when the current flowing through the parallel switch 2 becomes zero and the resistance voltage of the contact switch is lower than the voltage applied to the contact switch. This causes the breakdown of the parallel switch 2.

In the switching device 8 having the configuration shown in FIG. 4 and the function shown in FIGS. 5A to 5F as the first embodiment, the current flows through the thyristor 1, not through the parallel switch 2 when the parallel switch 2 is cut-off. Thereby, because the magnitude of the current flowing through the parallel switch 2, when the test current shown in the test shown in FIG. 6 is used, is smaller than that of the experimental data shown in FIG. 6 in which only the parallel switch is tested, no arc discharge is generated at the contact switch in the parallel switch 2 before the current zero-point.

From the above-described feature of the switching device 8 of the first embodiment, because the parallel switch 2 is incorporated in the switching device 8 of the first embodiment under better conditions than the experimental condition shown in FIG. 6, the parallel switch 2 can withstand the voltage applied to the parallel switch 2 after the current break.

Figure 7:
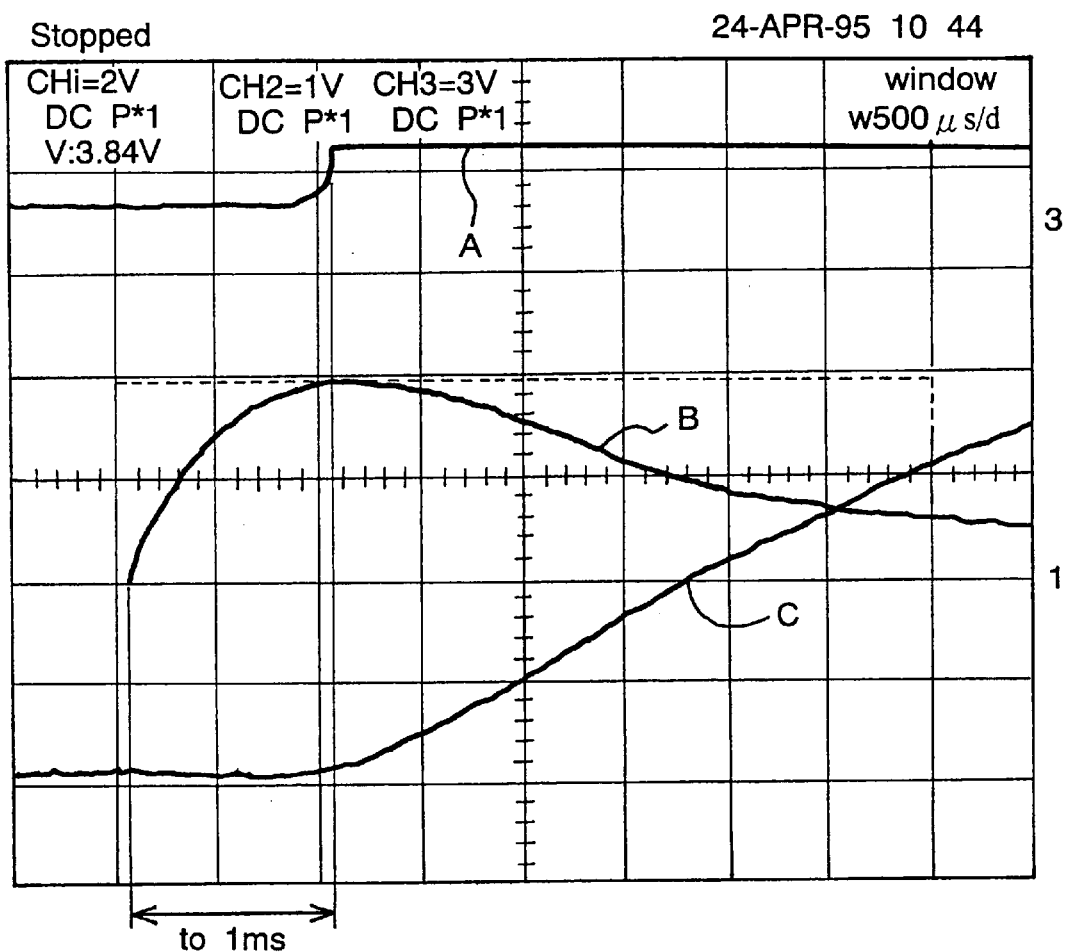
FIG. 7 is a graph showing experimental data of operation characteristics of the parallel switch only incorporated in the switching device of the first embodiment shown in FIG. 4.

FIG. 7 is a graph showing experimental data of the operational characteristics of only the parallel switch 2 incorporated in the switching device 8 of the first embodiment shown in FIG. 4.

In FIG. 7, the curve A designates a contact state of the contact switch in the parallel switch 2, the curve B indicates a voltage waveform of the opening control signal to be transferred to the parallel switch 2, and the curve C denotes the open distance of the contact switch in the parallel switch 2.

As clearly shown in FIG. 7, the contact of the contact switch is open after 1 msec is counted from the time when the parallel switch 2 receives the opening control signal transferred from the control section 3. This time is called as a contact opening time.

As described above in detail, in the switching device 8 of the first embodiment, the parallel switch 2 can resist the voltage applied to the parallel switch 2 after an elapsed-time reaches the zero time-point where no current flows and after 2.5 msec that is the sum of the opening time of 1 msec and the minimum breakable arc time of 1.5 msec counted after the parallel switch 2 receives the opening control signal.

Thus, the switching device of the first embodiment can break current paths completely.

Second Embodiment

Since the configuration of the switching device as the second embodiment is the same as that of the switching device 8 of the first embodiment shown in FIG. 4, the configuration elements of the switching device of the second embodiment are omitted here for brevity.

Figure 8A:
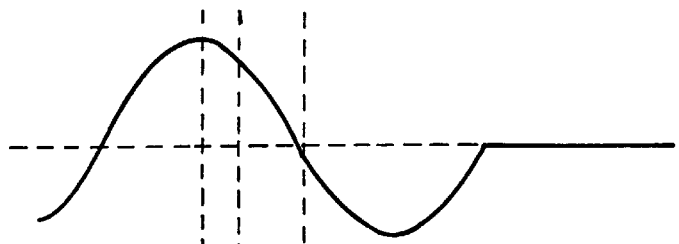
FIG. 8A is a waveform showing a time-change of the total current I1 flowing through a current path connected to the switching device according to the second embodiment.
Figure 8B:
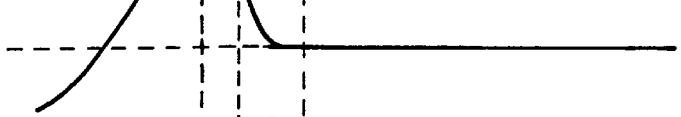
FIG. 8B is a waveform showing a time-change of the current I2 flowing through a parallel switch in the switching device of the second embodiment.
Figure 8C:
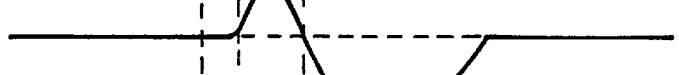
FIG. 8C is a waveform showing a time-change of the current I3 flowing through a current path connected to a thyristor circuit in the switching device of the second embodiment.
Figure 8D:
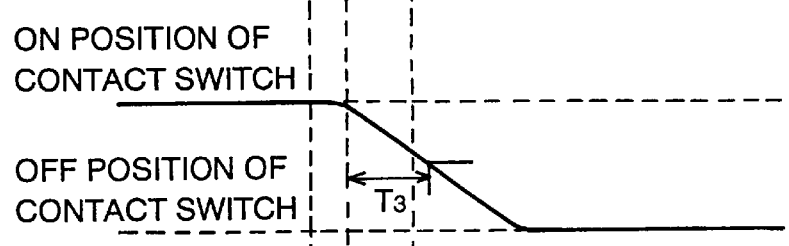
FIG. 8D shows a curve of an opening operation of the parallel switch in the switching device of the second embodiment.
Figure 8E:
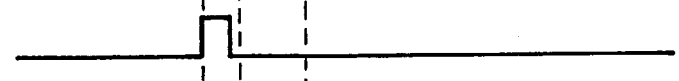
FIG. 8E shows a waveform of an opening control signal transferred from a control section to the parallel switch through a signal line 3a in the switching device of the second embodiment.
Figure 8F:
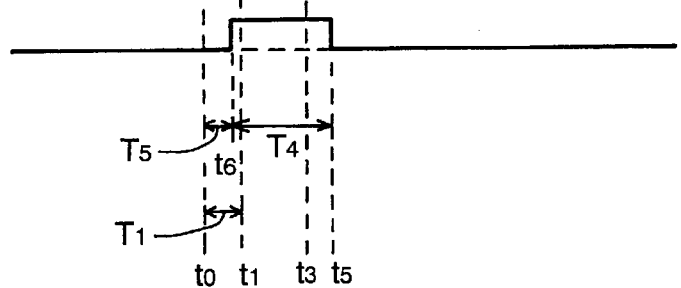
FIG. 8F is a waveform of a gate signal indicating a switching operation transferred from the control section to the thyristor circuit through a signal line 3b in the switching device of the second embodiment.

FIG. 8A is a waveform showing a time-change of the total current I1 flowing through a current path connected to the switching device according to the second embodiment. FIG. 8B is a waveform showing a time-change of the current I2 flowing through the parallel switch 2 in the switching device of the second embodiment. FIG. 8C is a waveform showing a time-change of the current I3 flowing through a current path connected to the thyristor circuit 1 in the switching device of the second embodiment. FIG. 8D shows a curve of an opening operation of the parallel switch 2 in the switching device of the second embodiment. FIG. 8E shows a waveform of an opening control signal transferred from the control section 3 to the parallel switch 2 through the signal line 3a in the switching device of the second embodiment. FIG. 8F is a waveform of a gate signal indicating a switching operation transferred from the control section 3 to the thyristor circuit 1 through the signal line 3b in the switching device of the second embodiment.

In the switching device of the second embodiment, the control section 3 transfers the gate control signal to the thyristor circuit 1 when the time T5 is elapsed counted after the control section 3 transfers the opening control signal to the parallel switch 2. In the second embodiment, it is set that the sum of the time T5 and the gate time-length T4 is larger than the sum of the opening time-length T1 of the parallel switch 2 and the minimum breakable arc time T3. Thereby, the parallel switch 2 has an adequate open distance to generate no arc discharge at the contact switch at the time t5 at which the gate control signal to be transferred to the thyristor 1 is changed from the ON state to the OFF state. Therefore the switching device of the second embodiment can have the same effect as that of the switching device of the first embodiment.

In the switching devices of the first and second embodiments described above in detail, the rating is 7.2 kV–12.5 kA and the opening time-length is 1 msec, and the minimum breakable arc time is 1.5 msec. The present invention is not limited by these conditions. That is, it can be acceptable to adjust the gate time-length of the gate control signal to be transferred to the thyristors (as semiconductor elements) in the thyristor circuit based on the changes of the rating, the opening time-length, and the minimum breakable arc time, because those values are changed according to the changes of the rated voltage, the rated current, the rated break current and the like, the configuration of the parallel switch, and the function of the contact switch in the switching device.

As set forth above in detail, according to the present invention, the control section in the switching device controls the semiconductor circuit comprising thyristors from ON state to OFF state after the time required to recover the voltage resistance of the contact switch in the parallel switch against the voltage applied to the switching device immediately after the control section indicates to open the current paths in the switching device, so that the switching device can break the current flowing through the current paths completely. It is thereby possible to increase the reliability of the switching device.

Further, in the switching device according to the present invention, after the control section transfers the opening-closing control signal indicating a break of the current path to the parallel switch, the control section changes the semiconductor circuit from the ON state to the OFF state after a sum of time to be required to open the contact switch in the parallel switch completely and a minimum time to be required to generate no arc discharge at the contact switch in the parallel switch is elapsed, so that the switching device can break the current flowing through the current paths completely. It is thereby possible to increase the reliability of the switching device.

In addition, in the switching device according to the present invention, the semiconductor circuit comprises thyristors, so that the switching device breaks the current flowing through the current paths completely. It is thereby possible to increase the reliability of the switching device.

Furthermore, in the switching device according to the present invention, the control section transfers simultaneously an opening control signal, to the parallel switch, indicating to open the current path connected to the parallel switch and a gate control signal indicating to change the thyristors from the ON state to the OFF state and to keep the ON state of the thyristors during not less than 2.5 msec to the thyristors. It is thereby possible to break the current path in the switching device having the rated 7.2 kV–12.5 kA completely.

Moreover, in the switching device according to the present invention, the control section transfers the gate control signal indicating to change the thyristors from the ON state to the OFF state after a time of not less than 2.5 msec is elapsed, counted after the opening control signal indicating to open the second current path connected to the parallel switch is transferred to the parallel switch. It is thereby possible to break the current path in the switching device completely.

Further, in the switching device according to the present invention, the semiconductor circuit comprises a plurality of semiconductor elements which are connected in parallel to each other and the connected direction of each semiconductor element is in opposite direction. It is thereby possible to perform a switching operation to an alternating current circuit with certainty.

Moreover, in the switching device according to the present invention, the contact switch in the parallel switch comprises a vacuum valve. It is thereby possible to prevent an accident based on arc discharge.

Moreover, in the switching device according to the present invention, an opening mechanism used in the parallel switch comprises an electromagnetic switching system. It is thereby possible to obtain the parallel switch of a high speed that can be performed with certainty and a high reliability with a low price.

Furthermore, in the switching device according to the present invention, the control section transfers a gate control signal, to the semiconductor circuit, indicating to change the semiconductor circuit from an OFF state to an ON state and to keep the ON state of the semiconductor circuit during a predetermined time-length after a first time is elapsed after the opening-closing control signal is transferred to the parallel switch, and wherein the control section controls so that a sum of the first time and a time-length of the gate control signal is larger than a sum of the opening time of the parallel switch and the minimum breakable arc time-length of the parallel switch. This configuration causes the switching device to break the current flowing through the current paths completely. It is thereby possible to increase the reliability of the switching device.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A switching device, comprising:
   a semiconductor circuit including a first current path therewith:
   a parallel switch having a contact switch connected to the semiconductor circuit for opening and closing a second current path placed in parallel with the first current path; and
   means for controlling the generation of opening-closing control signals which indicate when to open and to close the first current path and the second current path and for transferring the opening-closing control signals to the semiconductor circuit and the parallel switch, for switching the semiconductor circuit from an ON state to an OFF state after a predetermined time is elapsed which is required to keep a resistance of the contact switch greater than a voltage applied to the parallel switch such that no current flows through the parallel switch, said predetermined time being determined from immediately after the first current path and the second current path become open, such that no arc discharge is generated at the contact switch before said predetermined time has elapsed, and thus, the parallel switch cannot re-enter the ON state and an electronic breakdown is not incurred at the contact switch;
   wherein after the control section transfers one of the opening-closing control signals indicating a break of the second current path to the parallel switch, the control section changes the semiconductor circuit from the ON state to the OFF state after a period of time has elapsed which is required to completely open the contact switch in the parallel switch and a minimum time is elapsed which is required to not generate said arc discharge at the contact switch in the parallel switch.

2. A switching device as claimed in claim 1, wherein the semiconductor circuit comprises thyristors.

3. A switching device as claimed in claim 2, wherein the control section transfers simultaneously an opening control signal indicating when to open the second current path connected to the parallel switch to the parallel switch and a gate control signal indicating to change the thyristors from an ON state to an OFF state and to keep the ON state of the thyristors for not less than 2.5 msec in transferring the gate control signal to the thyristors.

4. A switching device as claimed in claim 2, wherein the control section transfers a gate control signal indicating when to change the thyristors from an ON state to an OFF state after a predetermined time of not less than 2.5 msec is elapsed, which is counted after the opening control signal indicating when to open the second current path which is connected to the parallel switch, is transferred to the parallel switch.

5. A switching device as claimed in claim 1, wherein the semiconductor circuit comprises a plurality of semiconductor elements which are connected in parallel with each other and the connected direction of each of said semiconductor elements is in an opposite direction to adjacent semiconductor elements.

6. A switching device as claimed in claim 3, wherein the semiconductor circuit comprises a plurality of semiconductor elements which are connected in parallel with each other and the connected direction of each of said semiconductor elements is in an opposite direction to adjacent semiconductor elements.

7. A switching device as claimed in claim 4, wherein the semiconductor circuit comprises a plurality of semiconductor elements which are connected in parallel with each other and the connected direction of each of said semiconductor elements is in an opposite direction to adjacent semiconductor elements.

8. A switching device as claimed in claim 1, wherein the contact switch in the parallel switch comprises a vacuum valve.

9. A switching device as claimed in claim 3, wherein the contact switch in the parallel switch comprises a vacuum valve.

10. A switching device as claimed in claim 1, wherein an opening mechanism used in the parallel switch comprises an electromagnetic switching system.

11. A switching device, comprising:
    a semiconductor circuit including a first current path therewith;
    a parallel switch having a contact switch connected to the semiconductor circuit for opening and closing a second current path placed in parallel with the first current path; and means for controlling the generation of opening-closing control signals which indicate when to open and to close the first current path and the second current path and for transferring the opening-closing control signals to the semiconductor circuit and the parallel switch, for switching the semiconductor circuit from an ON state to an OFF state after a predetermined time is elapsed which is required to keep a resistance of the contact switch greater than a voltage applied to the parallel switch such that no current flows through the parallel switch, said predetermined time being determined from immediately after the first current path and the second current path become open, such that no arc discharge is generated at the contact switch before said predetermined time has elapsed, and thus, the parallel switch cannot re-enter the ON state and an electronic breakdown is not incurred at the contact switch;

wherein the semiconductor circuit comprises thyristors; and wherein the control section transfers simultaneously an opening control signal to the parallel switch, indicating when to open the second current path connected to the parallel switch, and a gate control signal indicating to change the thyristors from an ON state to an OFF state and to keep the ON state of the thyristors for not less than 2.5 msec in transferring the gate control signal to the thyristors.

12. A switching device as claimed in claim 11, wherein the semiconductor circuit comprises a plurality of semiconductor elements which are connected in parallel with each other and the connected direction of each of said semiconductor elements is in an opposite direction to adjacent semiconductor elements.

13. A switching device as claimed in claim 11, wherein the contact switch in the parallel switch comprises a vacuum valve.

14. A switching device, comprising:

a semiconductor circuit including a first current path therewith;

a parallel switch having a contact switch connected to the semiconductor circuit for opening and closing a second current path placed in parallel with the first current path; and means for controlling the generation of opening-closing control signals which indicate when to open and to close the first current path and the second current path and for transferring the opening-closing control signals to the semiconductor circuit and the parallel switch, for switching the semiconductor circuit from an ON state to an OFF state after a predetermined time is elapsed which is required to keep a resistance of the contact switch greater than a voltage applied to the parallel switch such that no current flows through the parallel switch, said predetermined time being determined from immediately after the first current path and the second current path become open, such that no arc discharge is generated at the contact switch before said predetermined time has elapsed, and thus, the parallel switch cannot re-enter the ON state and an electronic breakdown is not incurred at the contact switch;

wherein the semiconductor circuit comprises thyristors; and wherein the control section transfers a gate control signal indicating when to change the thyristors from an ON state to an OFF state after a predetermined time of not less than 2.5 msec is elapsed, which is counted after the opening control signal indicating when to open the second current path which is connected to the parallel switch, is transferred to the parallel switch.

15. A switching device as claimed in claim 14, wherein the semiconductor circuit comprises a plurality of semiconductor elements which are connected in parallel with each other and the connected direction of each of said semiconductor elements is in an opposite direction to adjacent semiconductor elements.

16. A switching device, comprising:

a semiconductor circuit including a first current path therewith;

a parallel switch having a contact switch connected to the semiconductor circuit for opening and closing a second current path placed in parallel with the first current path; and means for controlling the generation of opening-closing control signals which indicate when to open and to close the first current path and the second current path and for transferring the opening-closing control signals to the semiconductor circuit and the parallel switch, for switching the semiconductor circuit from an ON state to an OFF state after a predetermined time is elapsed which is required to keep a resistance of the contact switch greater than a voltage applied to the parallel switch such that no current flows through the parallel switch, said predetermined time being determined from immediately after the first current path and the second current path become open, such that no arc discharge is generated at the contact switch before said predetermined time has elapsed, and thus, the parallel switch cannot re-enter the ON state and an electronic breakdown is not incurred at the contact switch;

wherein the control section transfers a gate control signal to the semiconductor circuit, indicating when to change the semiconductor circuit from the OFF state to the ON state and to keep the semiconductor circuit in the ON state during a predetermined time-length after a first time period is elapsed after the opening-closing control signal is transferred to the parallel switch, and wherein the control section controls timing so that a sum of the first time period and a time-length of the gate control signal is larger than a sum of an opening time of the parallel switch and a minimum breakable arc time-length of the parallel switch.

* * * * *